(12) United States Patent
Karhade et al.

(10) Patent No.: US 12,506,085 B2
(45) Date of Patent: Dec. 23, 2025

(54) HBI DIE ARCHITECTURE WITH FIDUCIAL IN STREET FOR NO METAL DEPOPULATION IN ACTIVE DIE

(71) Applicant: Intel Corporation, Santa Clara, CA (US)

(72) Inventors: Omkar Karhade, Chandler, AZ (US); Nitin A. Deshpande, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 852 days.

(21) Appl. No.: 17/561,547

(22) Filed: Dec. 23, 2021

(65) Prior Publication Data
US 2023/0207479 A1 Jun. 29, 2023

(51) Int. Cl.
*H01L 23/544* (2006.01)
*H01L 23/00* (2006.01)
*H01L 23/498* (2006.01)

(52) U.S. Cl.
CPC ............ *H01L 23/544* (2013.01); *H01L 24/08* (2013.01); *H01L 23/49816* (2013.01); *H01L 23/49833* (2013.01); *H01L 2223/54426* (2013.01); *H01L 2224/0213* (2013.01); *H01L 2224/0224* (2013.01); *H01L 2224/0801* (2013.01); *H01L 2224/08148* (2013.01)

(58) Field of Classification Search
None
See application file for complete search history.

(56) References Cited

U.S. PATENT DOCUMENTS

| | | | |
|---|---|---|---|
| 6,429,387 B1 | 8/2002 | Naoyuki | |
| 10,797,001 B2 * | 10/2020 | Chen | ................ H01L 23/528 |
| 11,309,223 B2 * | 4/2022 | Yu | ................ H01L 24/73 |
| 2013/0250298 A1 * | 9/2013 | Komuta | ................ G01B 11/272 |
| | | | 356/400 |
| 2014/0203429 A1 * | 7/2014 | Yu | ................ H01L 24/19 |
| | | | 257/737 |
| 2020/0043861 A1 * | 2/2020 | Chen | ................ H01L 24/20 |
| 2020/0294870 A1 * | 9/2020 | Yu | ................ H01L 25/0657 |

OTHER PUBLICATIONS

Search Report from European Patent Application No. 22215217.5, mailed Jul. 13, 2023, 8 pgs.

* cited by examiner

*Primary Examiner* — Nishath Yasmeen
(74) *Attorney, Agent, or Firm* — Schwabe, Williamson & Wyatt, P.C.

(57) ABSTRACT

Embodiments disclosed herein include semiconductor devices. In one embodiment, a die comprises a substrate, where the substrate comprises a semiconductor material. In an embodiment, a backend layer is over the substrate, where the backend layer comprises conductive routing. In an embodiment, the die further comprises a protrusion extending out from an edge of the substrate and the backend layer. In an embodiment, a fiducial is on a surface of the protrusion.

20 Claims, 13 Drawing Sheets

HBI DIE ARCHITECTURE WITH FIDUCIAL IN STREET FOR NO METAL DEPOPULATION IN ACTIVE DIE

TECHNICAL FIELD

Embodiments of the present disclosure relate to electronic packages, and more particularly to electronic packages with fiducial marks on a die that are outside of an active area of the die.

BACKGROUND

As the semiconductor industry drives to improved performance and interconnectivity between dies in an electronic package, new interconnect architectures are needed. One such interconnect architecture is hybrid bonding. In a hybrid bonding architecture, bonds between dies are made by both dielectric layers and the copper pads. The dielectric layers on each die bond together at low temperatures, and the opposing copper pads undergo solid state diffusion in order to complete the bond. Such a bonding architecture has been shown to enable small interconnect pitches between the copper pads. For example, pitches that are approximately 20 µm or smaller have been demonstrated with hybrid bonding architectures.

However, hybrid bonding requires post bonding inspection. The inspection allows for feedback of alignment accuracy to the bonding tool, as well as feed forward defective unit information for subsequent processing operations. Currently, the alignment is checked using an infrared (IR) inspection process. Particularly, IR is transparent to the silicon and can pass through the die to see a fiducial mark on the side of the die where the bond is made. In order to see the fiducial mark, the metals on inner layers over the fiducial marks need to be depopulated. These areas can often be 1,000 to 10,000 µm². Such large depopulated areas create challenges in the metal densities for plating processes. Additionally, the active area that needs to be depopulated cannot be used for product functionality.

EMBODIMENTS OF THE PRESENT DISCLOSURE

Figure 1A:
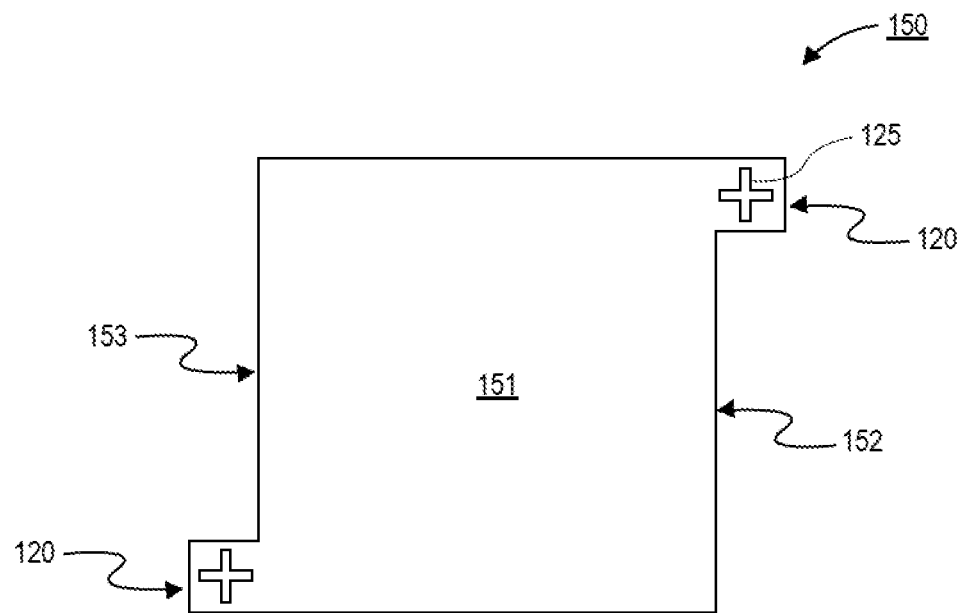
FIG. 1A is a plan view illustration of a die with protrusions on which fiducial marks are formed, in accordance with an embodiment.

Described herein are electronic packages with fiducial marks on a die that are outside of an active area of the die, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Hybrid bonding architectures include fine pitch connections between copper bumps. A dielectric layer surrounds the copper bumps. In an embodiment, the interface includes forming a bond between opposing dielectric layers, and implementing solid state diffusion bonding to bond the copper bumps. In this way, the hybrid bond includes two different types of bonds: a dielectric-to-dielectric bond, and a copper-to-copper bond. The pitch of the copper bumps can be relatively small compared to other interconnect architectures. For example, bump pitches can be approximately 20 µm or smaller. As such, high density interconnects can be made between a pair of dies in a die module or an electronic package.

With such fine pitches, alignment accuracy becomes a critical factor in providing high yielding die modules. Typically, alignment is checked by inspecting the overlay of fiducial marks. A first fiducial mark on a first die overlaps a second fiducial mark on a second die. The degree of the overlap indicates the amount of offset in the bonding process. In many instances infrared (IR) radiation is used to make the inspection of the fiducial marks. Silicon is transparent to IR radiation. As such, the fiducial can be provided below the die within an active area region. However, in order to pass through the substrate, the metal in the area above the fiducial mark needs to be depopulated. As noted above, this area can be on the order of 1,000 µm$^2$ to 10,000 µm$^2$. Such large areas of copper depopulation negatively impacts the copper density uniformity of the layers and makes plating processes difficult. Additionally, the area above the fiducial cannot be used for active circuitry since there cannot be copper in the area. As such, less area is provided for routing.

Accordingly, embodiments described herein include semiconductor dies that have fiducial structures that are provided outside a footprint of the active die region. In one embodiment, protrusions extend out from the edges of the die. A fiducial mark may be placed on the protrusion. In some embodiments, a single protrusion is used. In other embodiments, a pair of protrusions are provided on opposite corners of the die. In an embodiment, the volume of the protrusion may be free from metal. As such, an IR inspection can pass through a thickness of the protrusion to verify alignment of the underlying fiducial structure.

In an additional embodiment, the fiducial structure comprises one or more cantilever beams that extend out past an edge of the die. The cantilever beams may be on a top surface of the die or embedded in the die so that the cantilever beams come out from a sidewall of the die. Since the protrusions extend out past the edge of the die, there is no metal above the fiducial marks. Also, since the fiducial marks are not surrounded by the silicon, a visible light inspection may be used to check for alignment.

Referring now to FIG. 1A, a plan view illustration of a die 150 is shown, in accordance with an embodiment. In an embodiment, the die 150 may comprise a die substrate 151. The die substrate 151 may comprise a semiconductor material. For example, the die substrate 151 may comprise silicon. In an embodiment, the die substrate 151 may further comprise backend buildup layers that provide electrical routing to transistors or other active devices on the silicon substrate.

In an embodiment, one or more protrusions 120 may extend out from edges of the die substrate 151. For example, a first protrusion 120 may extend out from the die edge 152 and a second protrusion 120 may extend out from the die edge 153. It is to be appreciated that additional protrusions 120 may also be included. For example, protrusions 120 may also be formed out from the edges of the die substrate 151 between the edge 152 and the edge 153. Additionally, in the illustrated embodiment, the protrusions 120 are on opposite corners of the die substrate 151. In other embodiments, protrusions 120 may be provided on adjacent corners. Furthermore, while shown as being provided adjacent to corners of the die substrate 151, protrusions 120 may be provided at any location along the length of the die substrate edges 152 and 153.

In an embodiment, fiducial structures 125 may be provided over the protrusions 120. In the illustrated embodiment, the fiducial structures 125 are cross-shaped. However, it is to be appreciated that any suitable fiducial pattern or architecture can be used in accordance with embodiments described herein. Additionally, while the fiducial structures 125 over both protrusions 120 are shown as being similar, in other embodiments, different fiducial structures 125 may be provided on the protrusions 120. In an embodiment, the fiducial structures 125 may comprise copper, another metal, or any other material that is not transparent to IR radiation.

Figure 1B:
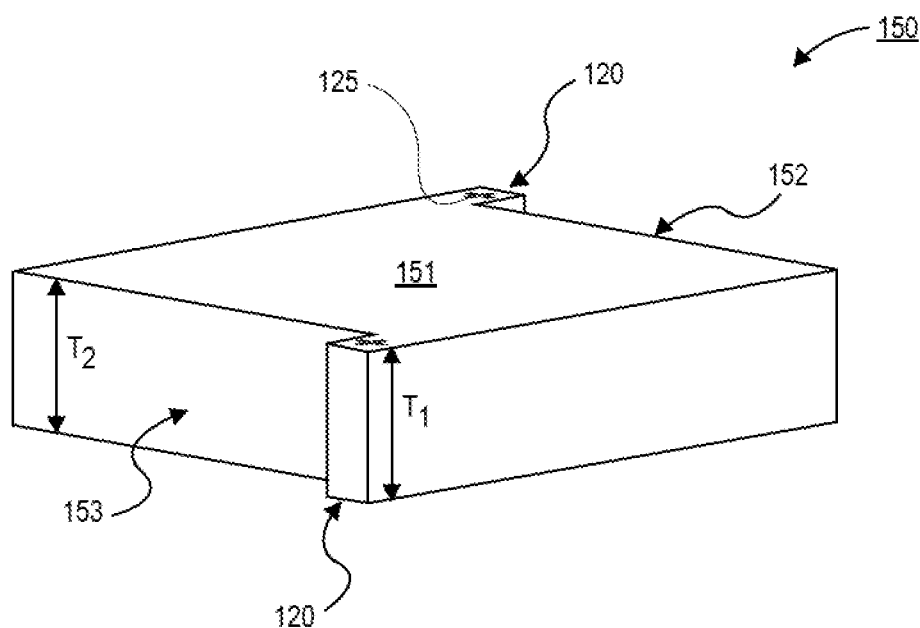
FIG. 1B is a perspective view illustration of a die with protrusions on which fiducial marks are formed, in accordance with an embodiment.

Referring now to FIG. 1B, a perspective view illustration of the die 150 is shown, in accordance with an additional embodiment. As shown, the protrusions 120 have a first thickness $T_1$ and the die substrate 151 has a second thickness $T_2$. In the illustrated embodiment, the first thickness $T_1$ is substantially equal to the second thickness $T_2$. As used herein, "substantially equal" may refer to two values that are within 30% of each other. For example, a first thickness $T_1$ that is 100 µm may be substantially equal to a second thickness $T_2$ that is 70 µm.

The two structures (i.e., the die substrate 151 and the protrusions 120) have a similar thickness because the protrusions 120 are formed with the same layers as the die substrate 151. For example, the protrusions 120 may include a semiconductor substrate and backend buildup layers over the semiconductor substrate. However, it is to be appreciated that the protrusions 120 may be free (or partially free) from metal (e.g., copper) except for the fiducial structure 125. As such, IR radiation may pass through the thickness of the protrusion in order to get an image of the location of the fiducial structure 125.

Additionally, it is to be appreciated that the fiducial structures 125 are provided on the surface of the die substrate 151 on which the interconnects are located. While shown as a substantially flat surface without any structural features in FIGS. 1A and 1B, it is to be appreciated that the top surface of the die substrate 151 illustrated in FIG. 1B includes a bonding interface. Particularly, the top surface of the die substrate 151 may be suitable for hybrid bonding. In such an embodiment, a layer of dielectric material may surround a plurality of bumps (e.g., copper bumps).

Figure 2A:
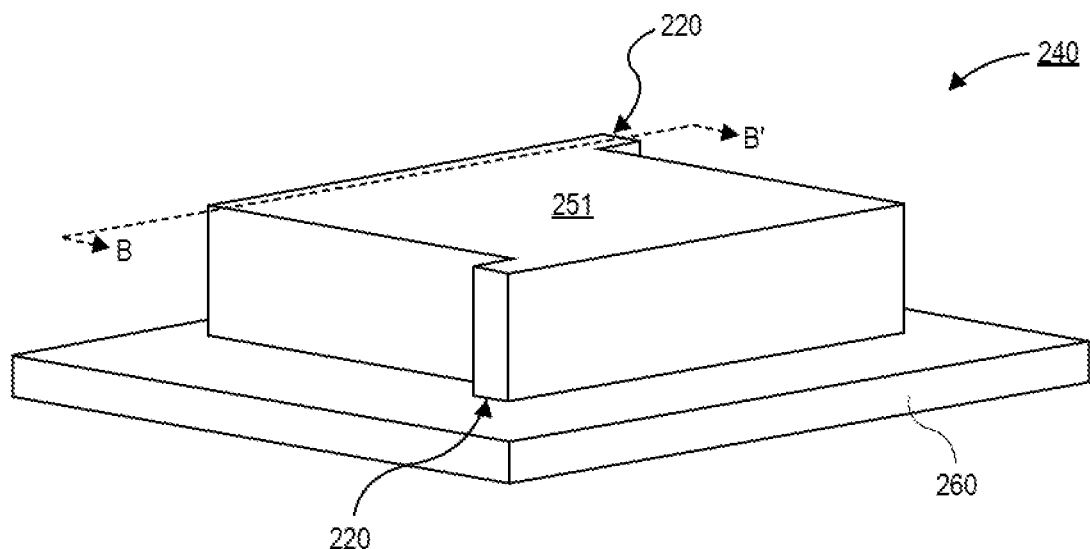
FIG. 2A is a perspective view illustration of a first die bonded to a second die, where the first die includes protrusions for fiducial marks, in accordance with an embodiment.

Referring now to FIG. 2A, a perspective view illustration of a die module 240 is shown, in accordance with an embodiment. In an embodiment, the die module 240 comprises a first die substrate 251 that is coupled to a second die substrate 260. In an embodiment, the first die substrate 251 is coupled to the second die substrate 260 by a hybrid bonding process, though it is to be appreciated that other bonding architectures (e.g., solder based bonding) may be used. In an embodiment, the second die substrate 260 may include a semiconductor substrate and buildup layers over a backend of the semiconductor substrate. The top layer of the second die substrate 260 may include a dielectric layer that surrounds bumps. A more detailed illustration of the hybrid bonding interface and the structure of the first die substrate 251 and the second die substrate 260 is shown in greater detail below with respect to FIG. 2B.

In an embodiment, a footprint of the second die substrate 260 may be greater than a footprint of the first die substrate 251. That is, the first die substrate 251 may be entirely within a footprint of the second die substrate 260. However, in other embodiments, the first die substrate 251 may have a footprint that substantially matches a footprint of the second die substrate 260. In an embodiment, the first die substrate 251 may include protrusions 220. The protrusions 220 may be similar to the protrusions 120 described in greater detail above. For example, the protrusions 220 may extend out from sidewalls of the first die substrate 251 near corners of the first die substrate 251. In an embodiment, the fiducial structures (not visible in FIG. 2A) are provided on the bottom surface of the protrusions 220 facing the second die substrate 260. Though, it is to be appreciated that the fiducial structures may be provided at any Z-height within the protrusions 220. Corresponding fiducial structures may be provided on the second die substrate 260.

Figure 2B:
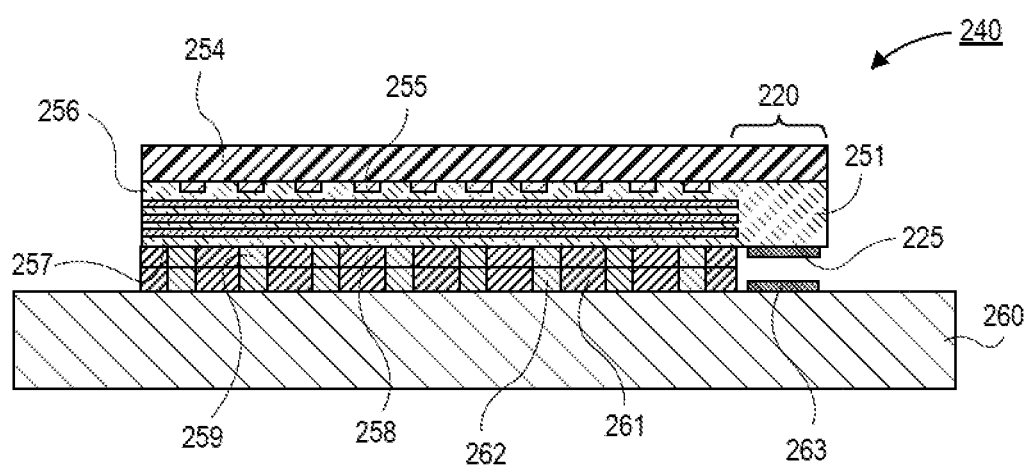
FIG. 2B is a cross-sectional illustration of a first die bonded to a second die that illustrates a hybrid bonding architecture, in accordance with an embodiment.

Referring now to FIG. 2B, a cross-sectional illustration of a die module 240 is shown, in accordance with an embodiment. The cross-sectional illustration in FIG. 2B is the cross-section of the die module 240 in FIG. 2A along line B-B'. In an embodiment, a first die substrate 251 is bonded to a second die substrate 260 with a hybrid bonding architecture. In an embodiment the second die substrate 260 may comprise a dielectric layer 261. The dielectric layer 261 may surround conductive bumps 262 (e.g., copper bumps). The first die substrate 251 may comprise a dielectric layer 258 that surrounds conductive bumps 259 (e.g., copper bumps). In an embodiment, the dielectric layer 261 may bond with the dielectric layer 258, and the conductive bumps 262 may bond with the conductive bumps 259. As such, the hybrid bond between the first die substrate 251 and the second die substrate 260 includes bonds between at least two different materials.

In an embodiment, the first die substrate 251 may include a semiconductor substrate 254. Transistor devices 255 or other active devices may be formed on and/or in the semiconductor substrate 254. Backend buildup layers 256 may be provided over the semiconductor substrate 254. Conductive routing 257 (e.g., traces, vias, etc.) may be provided through the backend buildup layers 256. However, as shown, the protrusion region 220 is free from conductive routing 257, transistor devices 255, and other structures. The fiducial structure 225 may be provided over the backend buildup layers 256.

The fiducial structure 225 may be provided over a fiducial structure 263 on the second die substrate 260. The fiducial structure 263 may also be a cross-shaped structure. However, it is to be appreciated that the fiducial structure 263 on the second die substrate 260 may be any suitable shape. For example, the fiducial structure 263 may be a box. In such an embodiment, alignment may be determined by checking to see if the cross of the first fiducial structure 225 is aligned in a center of the box of the second fiducial structure 263. In the illustrated embodiment, the fiducial structures 225 and 263 are not covered by any layers. However, it is to be appreciated that underfill material, dielectric material (e.g., from dielectric layers 261 or 258), or molding material may cover portions or all of the fiducial structures 225 and 263.

Figure 2C:
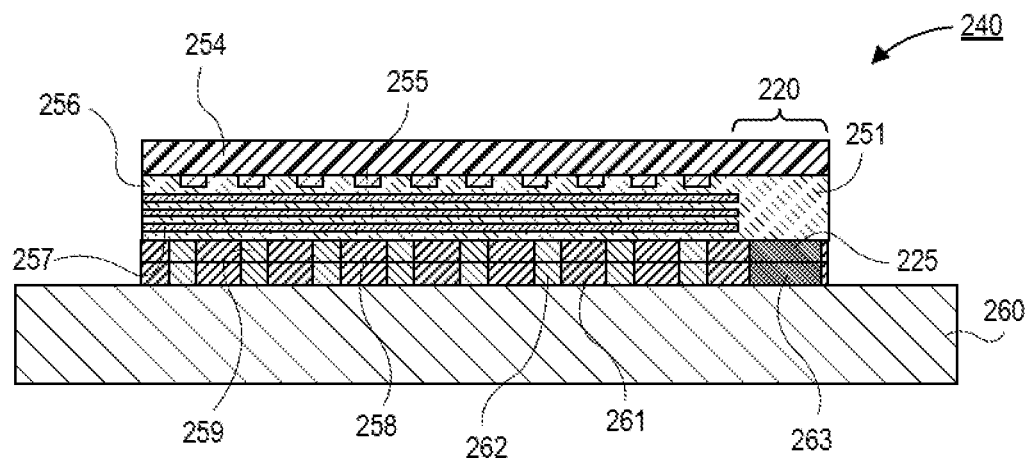
FIG. 2C is a cross-sectional illustration of a first die bonded to a second die that illustrates a hybrid bonding architecture, in accordance with an additional embodiment.

Referring now to FIG. 2C, a cross-sectional illustration of a die module 240 is shown, in accordance with an additional embodiment. In an embodiment, the die module 240 in FIG. 2C may be substantially similar to the die module 240 in FIG. 2B, with the exception of the fiducial structure 225 and the fiducial structure 263. As shown, a thickness of the fiducial structures 225 and 263 may be substantially similar to the thicknesses of the conductive bumps 259 and 262, respectively.

Figure 2D:
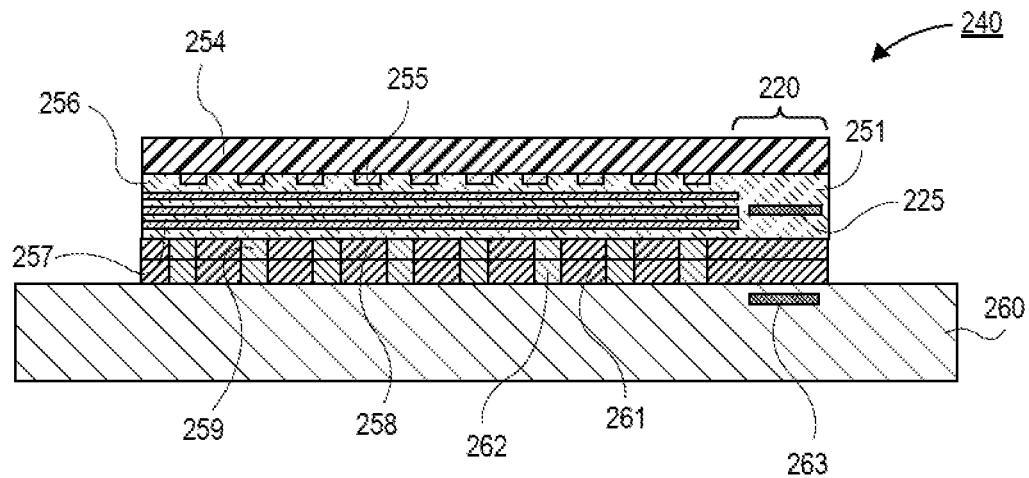
FIG. 2D is a cross-sectional illustration of a first die bonded to a second die that illustrates a hybrid bonding architecture with embedded fudicial marks.

Referring now to FIG. 2D, a cross-sectional illustration of a die module 240 is shown, in accordance with an additional embodiment. In an embodiment, the die module 240 in FIG. 2C may be substantially similar to the die module 240 in FIG. 2B, with the exception of the fiducial structure 225 and the fiducial structure 263. Instead of being at the hybrid bonding interface, the fiducial structure 225 may be embedded in the first die substrate 251, and the fiducial structure 263 may be embedded in the second die substrate 260.

Figure 3A:
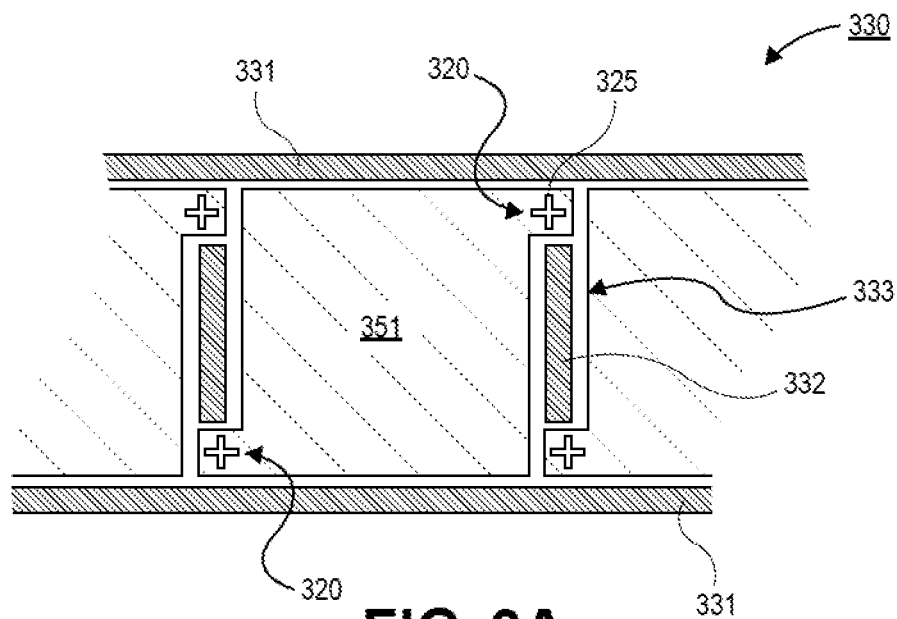
FIG. 3A is a plan view illustration of a portion of a wafer with a plurality of dies with protrusions for fiducial marks, in accordance with an embodiment.

Referring now to FIG. 3A, a plan view illustration of a portion of a wafer 330 is shown, in accordance with an embodiment. In an embodiment, the wafer 330 comprises a plurality of die substrates 351. For example, the die substrates 351 may be substantially similar to any of the die substrates described in greater detail above. For example, the die substrates 351 may comprise protrusions 320. Fiducial structures 325 may be provided on the protrusions 320. However, it is to be appreciated that the fiducial structures 325 may alternatively be buried within a thickness of the protrusions 320 instead of being on the surface. In an embodiment, a spacing between die edges of the die substrates 351 may be between approximately 100 μm and approximately 500 μm.

In an embodiment, conductive features 331 may be provided above and below the die substrates 351. Additionally, conductive features 332 may be provided between neighboring die substrates 351. In an embodiment, the die substrates 351 may be singulated by a plasma dicing process. For example, the white space 333 between the die substrates 351 and the conductive features 331 and 332 may be etched away with a plasma dicing operation. In an embodiment, a first plasma may etch through backend buildup layers, and a second plasma may etch through the underlying semiconductor substrate. As can be appreciated, the conductive features 332 may not be connected to the other conductive features 331. As such, conductive features 332 may form slivers after etching, which may be undesirable.

Figure 3B:
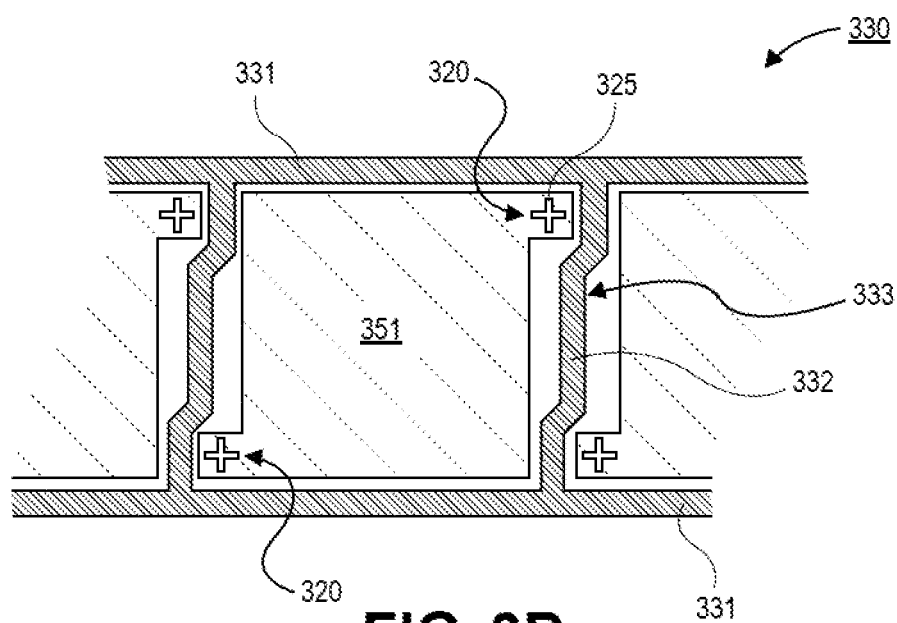
FIG. 3B is a plan view illustration of a portion of a wafer with a plurality of dies with protrusions for fiducial marks, in accordance with an additional embodiment.

Therefore, some embodiments may include the use of conductive features 332 that are connected to the conductive features 331. By connecting the conductive features 332 to larger conductive features 331, the possibility of forming slivers is reduced. An example of such an embodiment is shown in the plan view illustration of FIG. 3B. FIG. 3B includes a wafer 330 that is similar to the wafer 330 in FIG. 3A. For example, the wafer 330 may comprise a plurality of die substrates 351. Each of the die substrates 351 may include protrusions 320 with fiducial structures 325.

In an embodiment, the width between edges of the die substrates 351 may be increased (compared to what is shown in FIG. 3A). The additional width provides space for the conductive features 332 to directly connect to the conductive features 331. In order to minimize the need for additional spacing between the die substrates 351, the conductive features 332 may have one or more bends. For example, a first length may extend vertically up from the bottom conductive feature 331. After passing the bottom protrusion 320, the conductive feature may turn inwards and then extend vertically between the two protrusions 320. Before reaching the second protrusion 320 at the top of FIG. 3B, the conductive feature 332 may again turn to pass around the second protrusion 320. While one example of the path of the conductive feature 332 is shown, it is to be appreciated that the conductive feature 332 may have any path that connects the top conductive feature 331 to the bottom conductive feature 331. For example, the turns may be curved instead of the angular curves that are shown. Curved edges are enable by plasma etching and may be desirable to reduce high stress points. Additionally, as shown in FIG. 3C, a linear conductive feature 332 may connect the conductive features 331 together.

In the illustrations provided above, the fiducial structures are provided on protrusions that extend out from the edge of the die substrates. However, in other embodiments, the fiducial structures may extend out from the edge of the die substrate without the need for an overlying and/or underlying substrate. For example, a cantilever beam structure may extend out from the side of the die substrates. Embodiments with such a structure are shown in the Figures below.

Figure 3C:
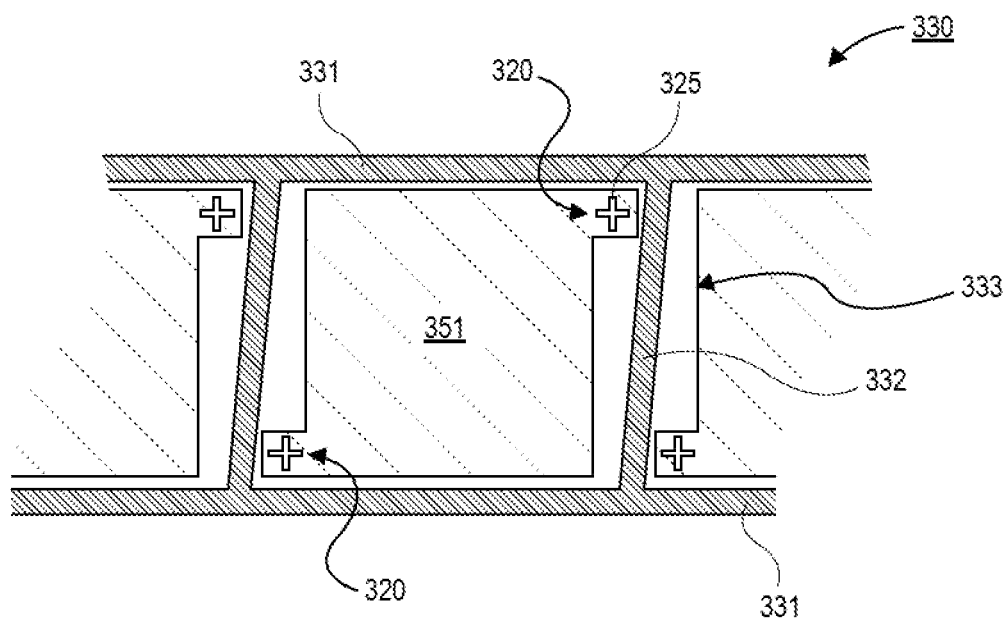
FIG. 3C is a plan view illustration of a portion of a wafer with a plurality of dies with protrusions for fiducial marks, in accordance with an additional embodiment.

Referring now to FIG. 3C, a plan view illustration of a portion of a wafer 330 is shown, in accordance with an embodiment. The wafer 330 may be substantially similar to the wafer 330 in FIG. 3B with the exception of the conductive features 332. Instead of having curves or turns, the conductive features 332 are straight lines.

Figure 4A:
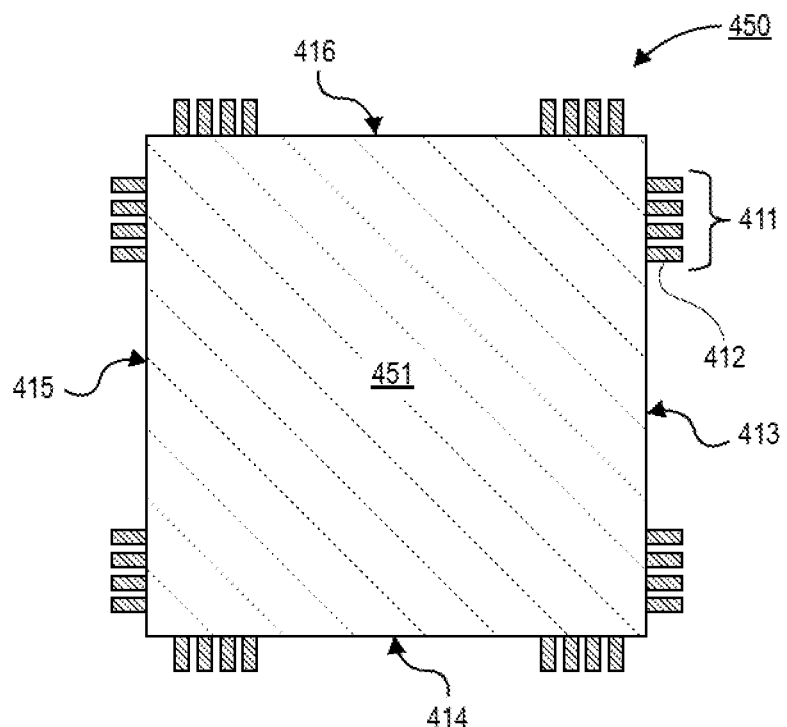
FIG. 4A is a plan view illustration of a die with fiducial structures that comprise cantilever beams that extend out past an edge of the die, in accordance with an embodiment.

Referring now to FIG. 4A, a plan view illustration of a die 450 is shown, in accordance with an embodiment. In an embodiment, the die 450 comprises a die substrate 451. The die substrate 451 may comprise a semiconductor substrate and backend buildup layers over the semiconductor substrate. In an embodiment, the die substrate 451 may comprise a plurality of edges. For example, a first edge 413, a second edge 414, a third edge 415, and a fourth edge 416 are provided in FIG. 4A.

In an embodiment, the die substrate 451 may include one or more fiducial structures 411. The fiducial structures 411 may each comprise one or more cantilever beams 412 that extend out from one of the edges 413-416. In the illustrated embodiment, each fiducial structure 411 comprises four cantilever beams 412. Though it is to be appreciated that fiducial structures 411 may have different numbers of cantilever beams or different shaped beams. Additionally, fiducial structures 411 may be different from each other within a single die substrate 451. For example, a first fiducial structure 411 may have four cantilever beams 412, and a second fiducial structure 411 may have three cantilever beams.

In an embodiment, each edge 413-416 may have one or more fiducial structures 411. For example, in the illustration shown in FIG. 4A, each edge 413-416 includes a pair of fiducial structures 411. One fiducial structure 411 is provided proximate to an end of each edge 413-416. However, in other embodiments, a fiducial structure 411 may be located more proximate to a center of each of the edges 413-416.

Figure 4B:
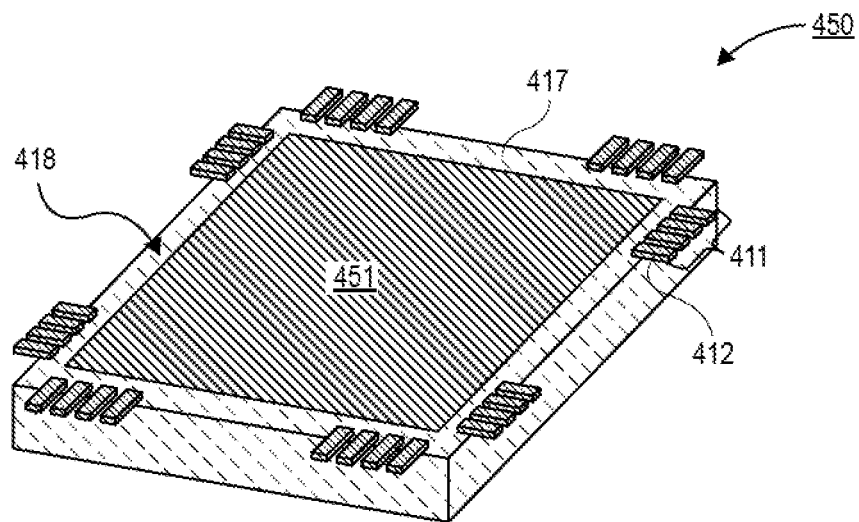
FIG. 4B is a perspective view illustration of a die with fiducial structures that comprise cantilever beams that are on a top surface of the die, in accordance with an embodiment.

Referring now to FIG. 4B, a perspective view illustration of a die 450 is shown, in accordance with an additional embodiment. As shown, the die substrate 451 has an outer ring 417 that is different from the interior active region. For example, the outer ring 417 may be the location where guard rings (not shown in FIG. 4B) are provided. Guard rings may protect the inner active region during dicing operations.

In an embodiment, the outer ring 417 may have a top surface 418. In an embodiment, the fiducial structures 411 are coupled to the top surface 418. The cantilever beams 412 of the fiducial structures 411 may be formed over the top surface 418 of the outer ring 417. That is, in some embodiments, the fiducial structures 411 do not extend into the inner active region of the die substrate 451.

As illustrated, the fiducial structures 411 are not surrounded by material of the die substrate 451. That is, there is no portion of the die substrate 451 above or below the cantilever beams outside of the die edges 413-416. As such, the inspection mechanism to determine if alignment is proper may be made using visible light since the light does not need to pass through the die substrate 451.

Figure 4C:
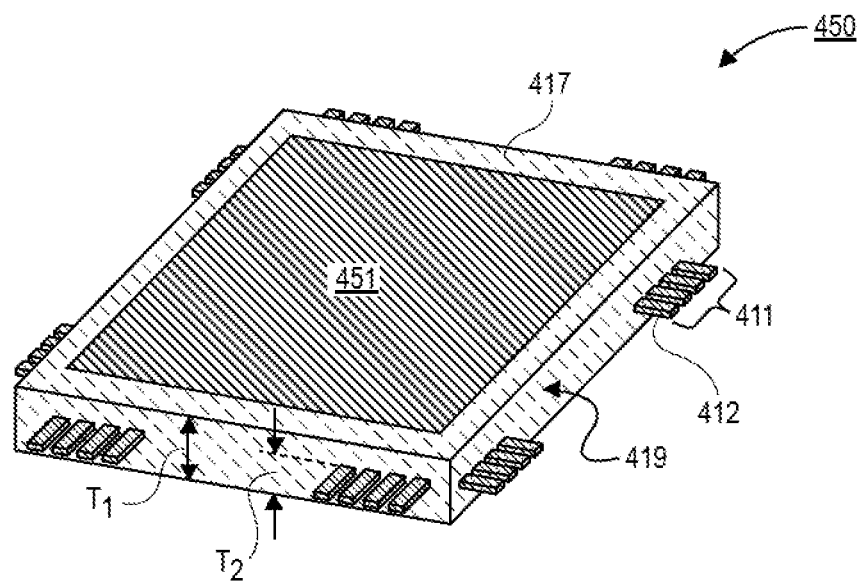
FIG. 4C is a perspective view illustration of a die with fiducial structures that comprise cantilever beams that extend out a sidewall of the die, in accordance with an embodiment.

Referring now to FIG. 4C, a perspective view illustration of a die 450 is shown, in accordance with yet another embodiment. Instead of being placed on the top surface 418 of the outer ring 417, the cantilever beams 412 of the fiducial structures 411 extend out sidewalls 419 of the outer ring 417. For example, the die substrate 451 may have a first thickness $T_1$ and the cantilever beams 412 may extend out the sidewalls 419 at a second thickness $T_2$ into the die substrate 451. That is, the fiducial structures 411 do not need to be on the top or bottom surfaces of the die substrate 451 in all embodiments.

Figure 5A:
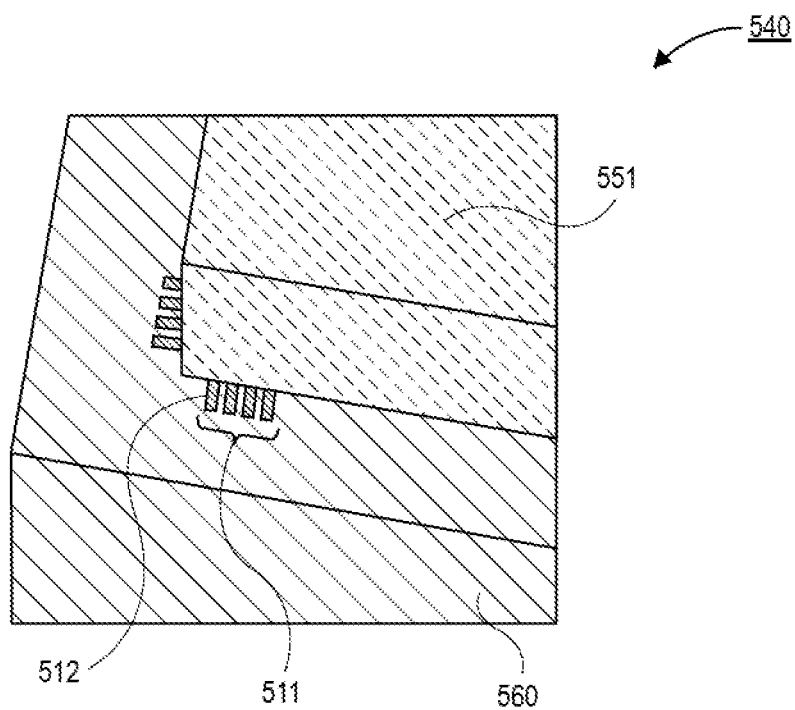
FIG. 5A is a perspective view illustration of a portion of a first die mounted to a second die with cantilever fiducial structures, in accordance with an embodiment.

Referring now to FIG. 5A, a perspective view illustration of a die module 540 is shown, in accordance with an embodiment. In an embodiment, the die module 540 comprises a first die substrate 551 and a second die substrate 560. The first die substrate 551 may be coupled to the second die substrate 560 by any bonding architecture. In some embodiments, the bonding architecture is a hybrid bonding architecture, which will be described in greater detail below.

In an embodiment, the first die substrate 551 has a footprint that is smaller than a footprint of the second die substrate 560. As such, the cantilever beams 512 of the fiducial structures 511 extend over a top surface of the second substrate 560. In an embodiment, fiducial structures 511 may also be provided on the second substrate 560. In the illustrated embodiment, the fiducial structures 511 on the second substrate 560 are entirely overlapped by the fiducial structures 511 and are not visible. However, if there were to be misalignment between the first die substrate 551 and the second die substrate 560, then the fiducial structures 511 on the second substrate 560 may be visible. However, in other embodiments, the fiducial structures 511 on the second substrate 560 may be visible even when there is proper alignment between the first die substrate 551 and the second die substrate 560.

Figure 5B:
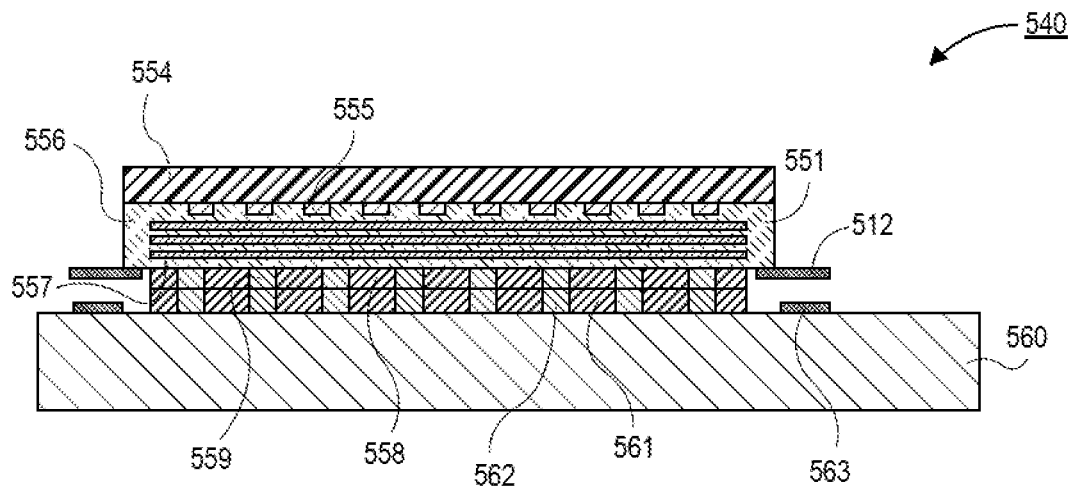
FIG. 5B is a cross-sectional illustration of a first die bonded to a second die with a hybrid bonding architecture with cantilever fiducial structures, in accordance with an embodiment.

Referring now to FIG. 5B, a cross-sectional illustration of a die module 540 is shown, in accordance with an embodiment. In an embodiment, a first die substrate 551 is bonded to a second die substrate 560 with a hybrid bonding architecture. In an embodiment the second die substrate 560 may comprise a dielectric layer 561. The dielectric layer 561 may surround conductive bumps 562 (e.g., copper bumps). The first die substrate 551 may comprise a dielectric layer 558 that surrounds conductive bumps 559 (e.g., copper bumps). In an embodiment, the dielectric layer 561 may bond with the dielectric layer 558, and the conductive bumps 562 may bond with the conductive bumps 559. As such, the hybrid bond between the first die substrate 551 and the second die substrate 560 includes bonds between at least two different materials.

In an embodiment, the first die substrate 551 may include a semiconductor substrate 554. Transistor devices 555 or other active devices may be formed on and/or in the semiconductor substrate 554. Backend buildup layers 556 may be provided over the semiconductor substrate 554. Conductive routing 557 (e.g., traces, vias, etc.) may be provided through the backend buildup layers 556. In an embodiment, the cantilever beam 512 of a fiducial structure may be provided over the backend buildup layers 556.

The cantilever beam 512 may be provided over a fiducial structure 563 on the second die substrate 560. The fiducial structure 563 may also be a rectangular shape. However, it is to be appreciated that the fiducial structure 563 on the second die substrate 560 may be any suitable shape. For example, the fiducial structure 563 may be a box. In such an embodiment, alignment may be determined by checking to see if the cantilever beam 512 is aligned in a center of the box of the fiducial structure 563. In the illustrated embodiment, the cantilever beam 512 and the fiducial structure 563 are not covered by any layers. However, it is to be appreciated that underfill material, dielectric material (e.g., from dielectric layers 561 or 558), or molding material may cover portions or all of the cantilever beam 512 or the fiducial structure 563.

Figure 5C:
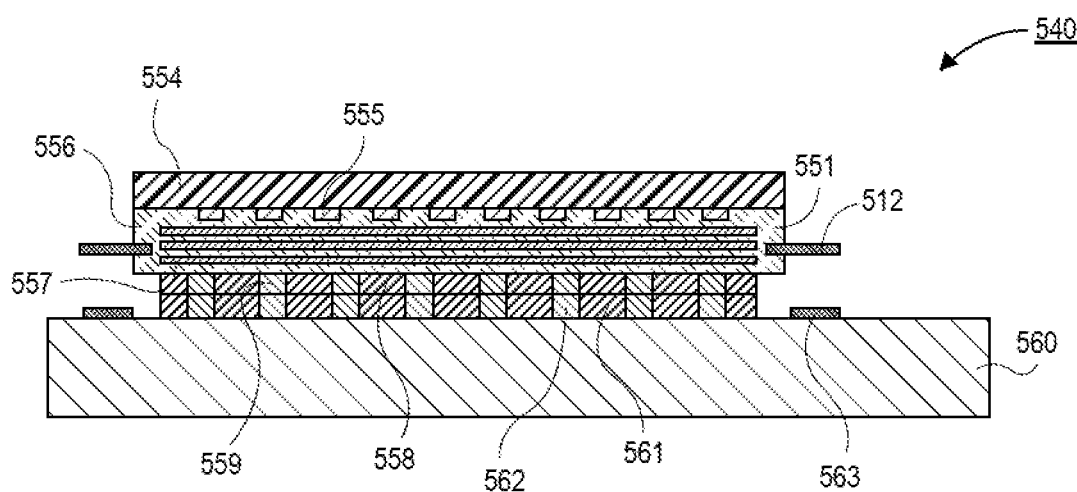
FIG. 5C is a cross-sectional illustration of a first die bonded to a second die with a hybrid bonding architecture with cantilever fiducial structures, in accordance with an additional embodiment.

Referring now to FIG. 5C, a cross-sectional illustration of a die module 540 is shown, in accordance with an additional embodiment. In an embodiment, a first die substrate 551 is bonded to a second die substrate 560 with a hybrid bonding architecture. In an embodiment the second die substrate 560 may comprise a dielectric layer 561. The dielectric layer 561 may surround conductive bumps 562 (e.g., copper bumps). The first die substrate 551 may comprise a dielectric layer 558 that surrounds conductive bumps 559 (e.g., copper bumps). In an embodiment, the dielectric layer 561 may bond with the dielectric layer 558, and the conductive bumps 562 may bond with the conductive bumps 559. As such, the hybrid bond between the first die substrate 551 and the second die substrate 560 includes bonds between at least two different materials.

In an embodiment, the first die substrate 551 may include a semiconductor substrate 554. Transistor devices 555 or other active devices may be formed on and/or in the semiconductor substrate 554. Backend buildup layers 556 may be provided over the semiconductor substrate 554. Conductive routing 557 (e.g., traces, vias, etc.) may be provided through the backend buildup layers 556. In an embodiment, the cantilever beam 512 of a fiducial structure may be provided over an intermediate buildup layer 556. That is, the cantilever beam 512 may extend out a sidewall of the first die substrate 551.

The cantilever beam 512 may be provided over a fiducial structure 563 on the second die substrate 560. The fiducial structure 563 may also be a rectangular shape. However, it is to be appreciated that the fiducial structure 563 on the second die substrate 560 may be any suitable shape. For example, the fiducial structure 563 may be a box. In such an embodiment, alignment may be determined by checking to see if the cantilever beam 512 is aligned in a center of the box of the fiducial structure 563. In the illustrated embodiment, the cantilever beam 512 and the fiducial structure 563 are not covered by any layers. However, it is to be appreciated that underfill material, dielectric material (e.g., from dielectric layers 561 or 558), or molding material may cover portions or all of the cantilever beam 512 or the fiducial structure 563.

Figure 5D:
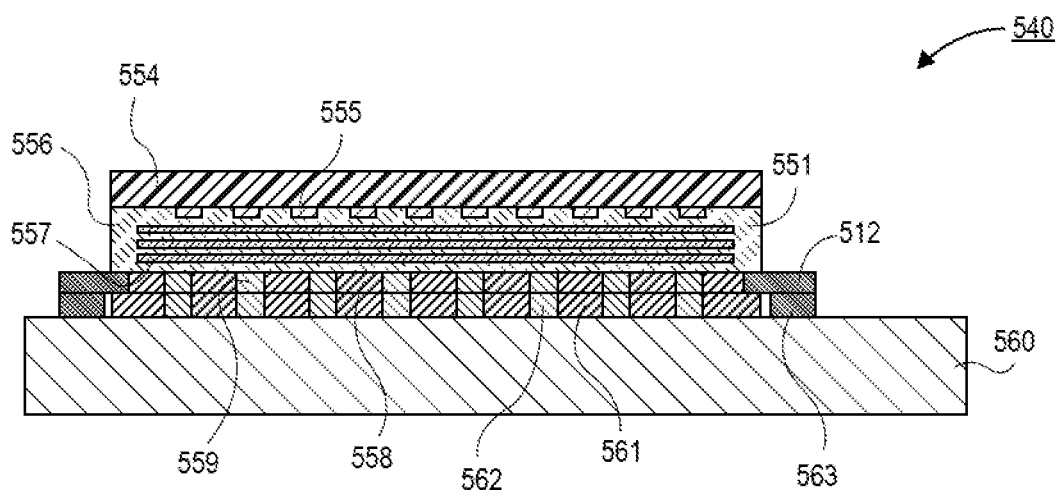
FIG. 5D is a cross-sectional illustration of a first die bonded to a second die with a hybrid bonding architecture, in accordance with an additional embodiment.

Referring now to FIG. 5D, a cross-sectional illustration of a die module 540 is shown, in accordance with an additional embodiment. The die module 540 in FIG. 5D may be substantially similar to the die module 540 in FIG. 5B, with the exception of the cantilever beam 512 and the fiducial structure 563. As shown, a thickness of the cantilever beam 512 may be substantially similar to a thickness of the conductive bumps 559, and a thickness of the fiducial structure 563 may be substantially similar to a thickness of the conductive bumps 562.

Figure 6:
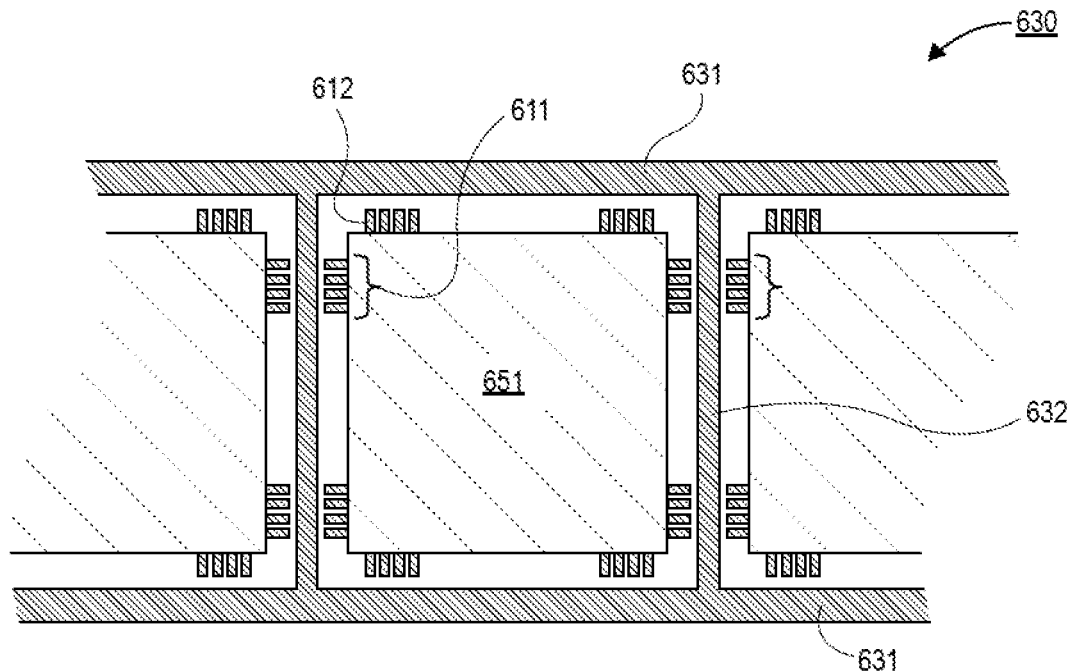
FIG. 6 is a plan view illustration of a wafer with a plurality of dies that include cantilever fiducial structures, in accordance with an embodiment.

Referring now to FIG. 6, a plan view illustration of a portion of a wafer 630 is shown, in accordance with an embodiment. In an embodiment, the wafer 630 comprises a plurality of die substrates 651. In an embodiment, the die substrates 651 may be substantially similar to some of the die substrates described in greater detail above. In a particular embodiment, one or more fiducial structures 611 may be provided around a perimeter of the die substrates 651. Each of the fiducial structures 611 may comprise a plurality of cantilever beams 612 that extend out from edges of the die substrate 651. For example, in FIG. 6 each die substrate 651 includes eight fiducial structures 611. That is, a pair of fiducial structures 611 may be provided on each edge of the die substrate 651.

Each of the die substrates 651 may be surrounded by conductive features 631 and 632. The conductive features 631 and 632 may be provided within the scribe lines between the die substrates 651. In an embodiment, the white space between the die substrates 651 and the conductive features 631 may be removed with an etching process. For example, the singulation process may be a plasma etching process to remove the material located in the white space in FIG. 6.

Figure 7A:
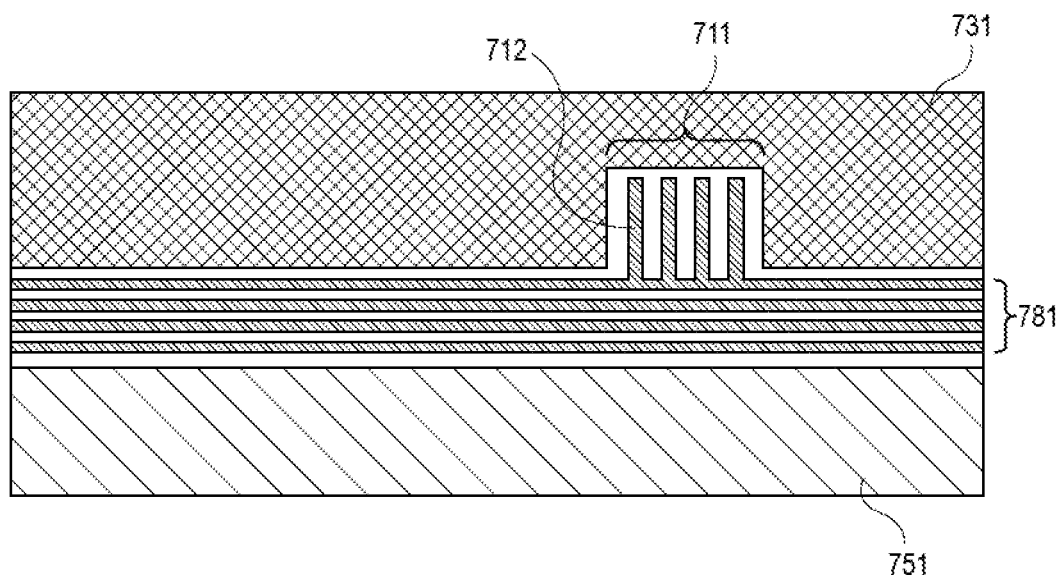
FIG. 7A is a plan view illustration of a portion of a die and cantilever fiducials extending out from a guard ring, in accordance with an embodiment.

Referring now to FIG. 7A, a zoomed in plan view illustration of a portion of a die substrate 751 is shown, in accordance with an embodiment. As shown, a guard ring region 781 may be provided around edges of the die substrate 751. The guard ring region 781 may comprise one or more conductive rings that surround a perimeter of the die substrate 751 in order to protect the die substrate 751 during a singulation process. In an embodiment, the fiducial structure 711 may extend out from an outer portion of the guard ring region 781. That is, the cantilever beams 712 may be directly connected to one or more of the guard rings in the guard ring region 781. However in other embodiments, the cantilever beams 712 may be disconnected from the guard ring region 781. Additionally, the fiducial structure 711 may extend into the conductive feature 731 in the singulation streets adjacent to the die substrate 751. In an embodiment, the cantilever beams 712 are made from a material which does not get etched by the front side deep etch and the backside plasma etching of the silicon in the die substrate 751.

Figure 7B:
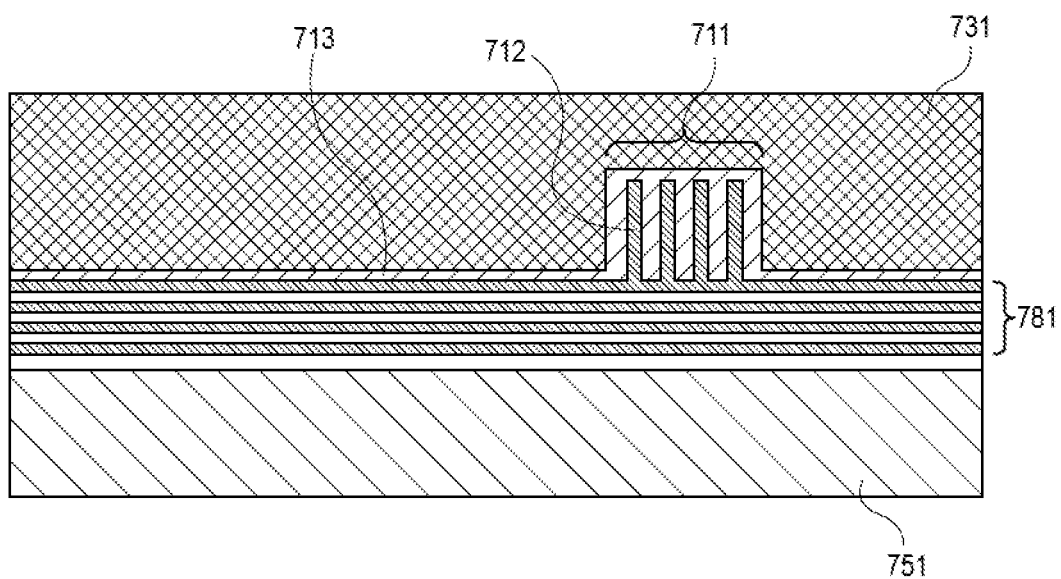
FIG. 7B is a plan view illustration of a portion of a die and cantilever fiducials extending out from a guard ring, in accordance with an additional embodiment.

Referring now to FIG. 7B, a plan view illustration of a portion of a die substrate 751 is shown, in accordance with an additional embodiment. In an embodiment, the structure in FIG. 7B may be substantially similar to the structure shown and described in FIG. 7A, with the exception of the presence of a narrow metal free zone 713 outside of the guard ring region 781. In an embodiment, a deep trench etch of the metal free zone 713 isolates the conductive features 731 in the street from the conductors of the die substrate 751. A backside plasma etch may then be used to remove the silicon from the street region.

Figure 8:
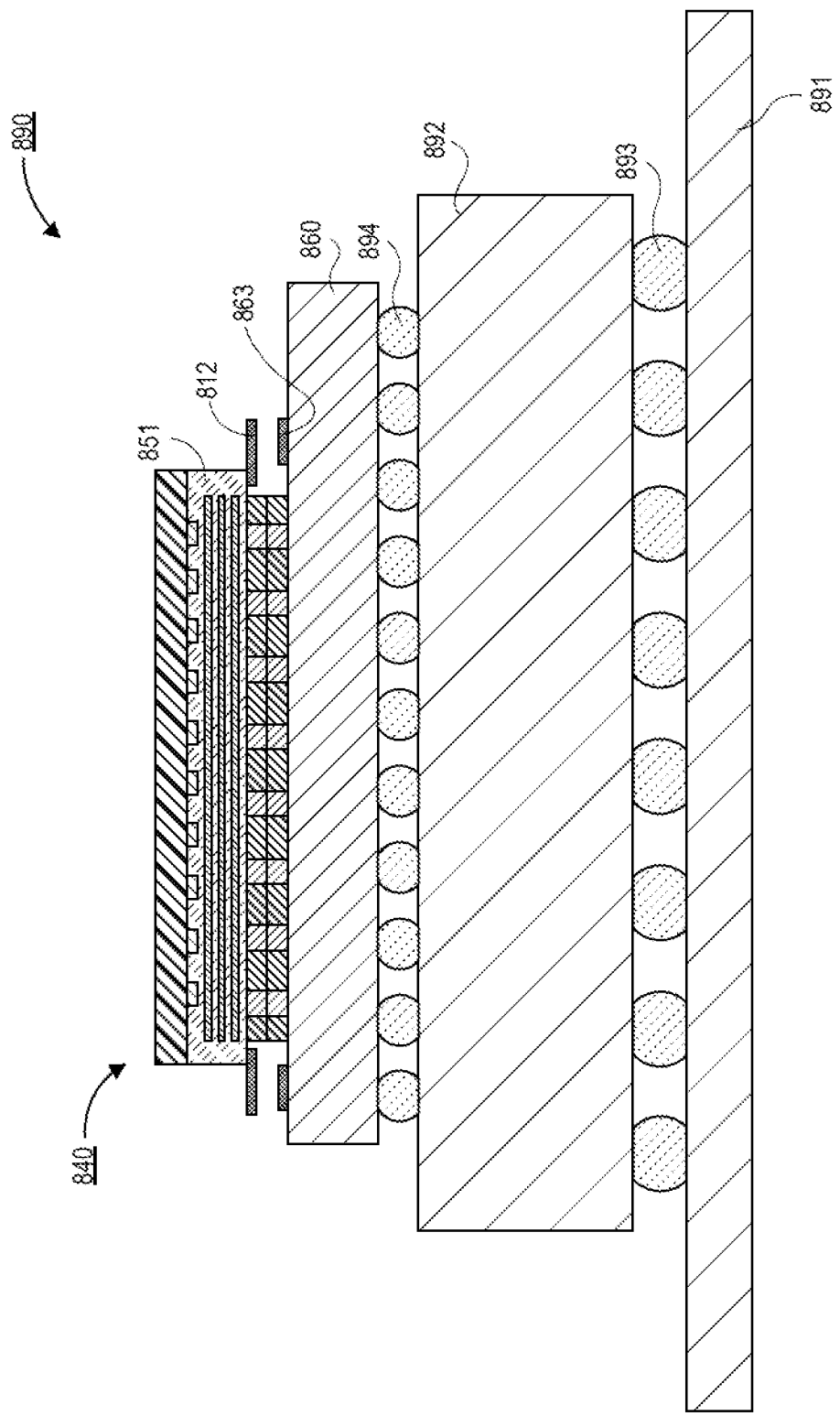
FIG. 8 is a cross-sectional illustration of an electronic system with a die module that includes a hybrid bonding interconnect between a pair of dies with a fiducial structure extending out from a side of one of the dies, in accordance with an embodiment.

Referring now to FIG. 8, a cross-sectional illustration of an electronic system 890 is shown, in accordance with an embodiment. In an embodiment, the electronic system 890 comprises a board 891, such as a printed circuit board (PCB). In an embodiment, the board 891 may be coupled to a package substrate 892 by interconnects 893. In an embodiment, the interconnects 893 comprise solder balls. However, in other embodiments, the interconnects 893 may include sockets or any other suitable interconnect architecture.

In an embodiment, a die module 840 is coupled to the package substrate 892. For example, the die module 840 may be coupled to the package substrate by first level interconnects 894, such as solder balls, bumps, or the like. In an embodiment, the die module 840 comprises a first die substrate 851 and a second die substrate 860. The first die substrate 851 may be electrically coupled to the second die substrate 860 by a hybrid bonding architecture. For example, copper bumps are bonded together and surrounded by dielectric layers that are also bonded together.

In an embodiment, the first die 851 may include a fiducial structure. For example, a cantilever beam 812 may extend out from an edge of the first die 851. The cantilever beam 812 may at least partially overlap a fiducial structure 863 on the underlying second die substrate 860. The alignment between the cantilever beam 812 and the fiducial structure 863 can be used to determine the alignment of the first die substrate 851 to the second die substrate 860. While a die module similar to the structure shown in FIG. 5B is used as an example, it is to be appreciated that any die module described herein may be used in the electronic system 890.

Figure 9:
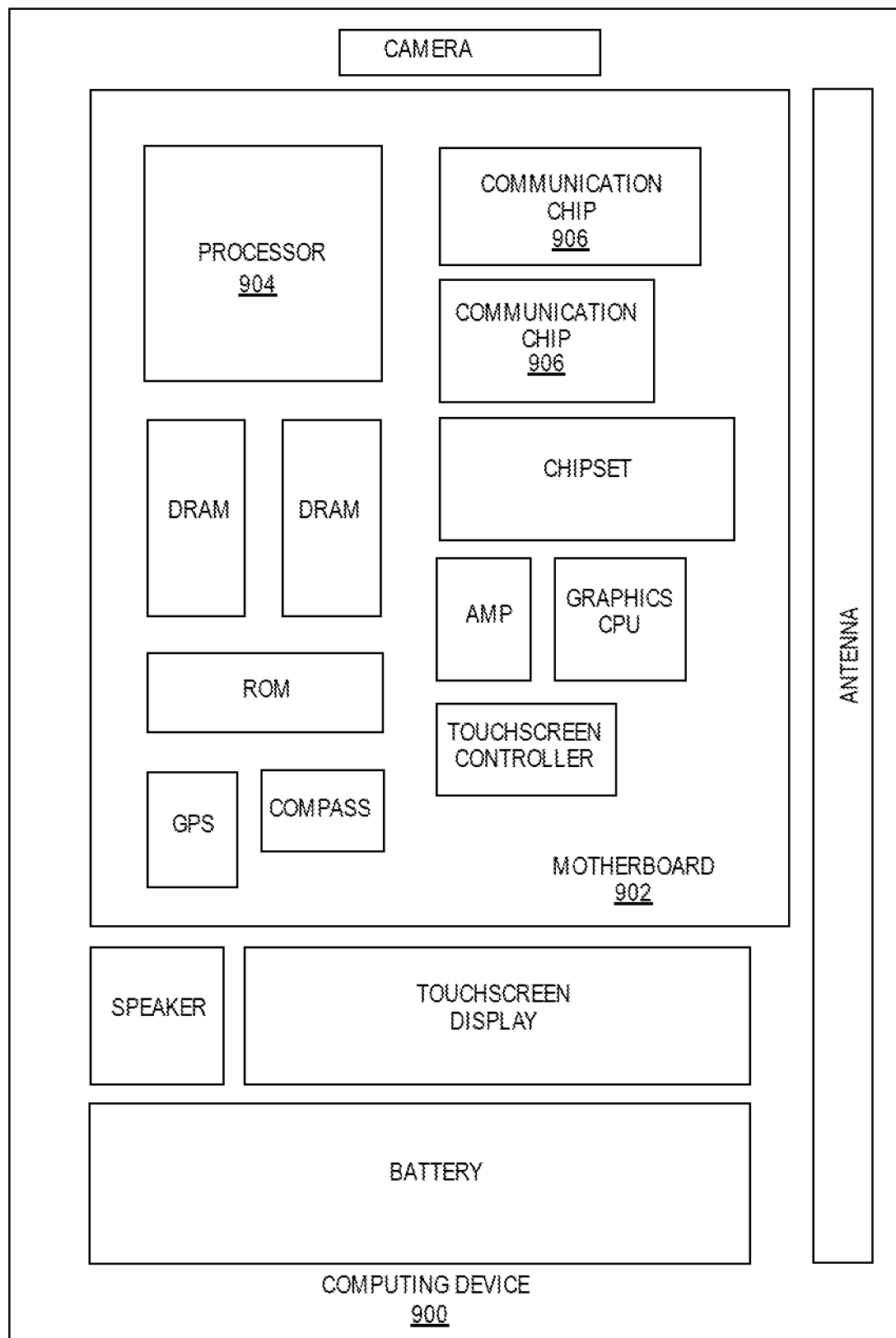
FIG. 9 is a schematic of a computing device built in accordance with an embodiment.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor may be part of an electronic package that comprises a die module with hybrid bonded dies and fiducial structures, in accordance with embodiments described herein. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip may be part of an electronic package that comprises a die module with hybrid bonded dies and fiducial structures, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a die, comprising: a substrate, wherein the substrate comprises a semiconductor material; a backend layer over the substrate, wherein the backend layer comprises conductive routing; a protrusion extending out from an edge of the substrate and the backend layer; and a fiducial on a surface of the protrusion.

Example 2: the die of Example 1, wherein no metal is provided through a thickness of the protrusion.

Example 3: the die of Example 1 or Example 2, wherein the protrusion is at a corner of the substrate.

Example 4: the die of Examples 1-3, further comprising: a second protrusion extending out from a second edge of the substrate and the backend layer.

Example 5: the die of Example 4, wherein the second protrusion is at a corner of the substrate opposite from a corner of the substrate where the protrusion is located.

Example 6: the die of Examples 1-5, wherein the fiducial is a cross.

Example 7: the die of Examples 1-6, wherein the die further comprises a dielectric layer and a plurality of conductive pads through the dielectric layer.

Example 8: the die of Example 7, wherein the conductive pads and the dielectric layer are suitable for hybrid bonding or solder bonding.

Example 9: the die of Example 7, wherein the conductive pads have a pitch that is approximately 20 µm or less.

Example 10: the die of Examples 1-9, further comprising: transistors on the substrate, wherein no transistors are provided within a footprint of the fiducial.

Example 11: an electronic package, comprising: a first die; a protrusion extending out from the first die; a first fiducial on the protrusion; a second die bonded to the first die; and a second fiducial on the second die, wherein the first fiducial at least partially overlaps the second fiducial.

Example 12: the electronic package of Example 11, wherein the first die is bonded to the second die with a hybrid bonding architecture.

Example 13: the electronic package of Example 11 or Example 12, wherein the first die has an active die region, and wherein the fiducial is outside of a footprint of the active die region.

Example 14: the electronic package of Examples 11-13, wherein further comprising: a second protrusion extending out from the first die.

Example 15: the electronic package of Example 14, wherein the second protrusion is on a corner of the first die opposite from a corner where the protrusion is located.

Example 16: the electronic package of Examples 11-15, wherein the second fiducial is within an active die region of the second die.

Example 17: the electronic package of Examples 11-16, wherein the first fiducial and the second fiducial are crosses.

Example 18: an electronic system, comprising: a board; a package substrate coupled to the board; a first die on the package substrate; and a second die coupled to the first die, wherein the second die comprises: a protrusion that extends out from a corner of the second die; and a fiducial on the protrusion, wherein the fiducial is outside of a shadow of an active die region of the second die.

Example 19: the electronic system of Example 18, wherein there is no metal over the fiducial in the second die.

Example 20: the electronic system of Example 18 or Example 19, wherein the first die is coupled to the second die with a hybrid bonding interconnect architecture.

What is claimed is:

1. A die, comprising:
   a substrate having a first surface opposite a second surface, and a plurality of edges between the first surface and the second surface, wherein the substrate comprises a semiconductor material;
   a backend layer over the first surface of the substrate, wherein the backend layer comprises conductive routing;
   a protrusion extending laterally out from an edge of the plurality of edges of the substrate and the backend layer; and
   a fiducial on a surface of the protrusion.

2. The die of claim 1, wherein no metal is provided through a thickness of the protrusion.

3. The die of claim 1, wherein the protrusion is at a corner of the substrate.

4. The die of claim 1, further comprising:
   a second protrusion extending out from a second edge of the substrate and the backend layer.

5. The die of claim 4, wherein the second protrusion is at a corner of the substrate opposite from a corner of the substrate where the protrusion is located.

6. The die of claim 1, wherein the fiducial is a cross.

7. The die of claim 1, wherein the die further comprises a dielectric layer and a plurality of conductive pads through the dielectric layer.

8. The die of claim 7, wherein the conductive pads and the dielectric layer are suitable for hybrid bonding or solder bonding.

9. The die of claim 7, wherein the conductive pads have a pitch that is approximately 20 μm or less.

10. The die of claim 1, further comprising:
    transistors on the substrate, wherein no transistors are provided within a footprint of the fiducial.

11. An electronic package, comprising:
    a first die having a first surface opposite a second surface, and a plurality of edges between the first surface and the second surface;
    a protrusion extending laterally out from an edge of the plurality of edges of the first die;
    a first fiducial on the protrusion;
    a second die bonded to the first die; and
    a second fiducial on the second die, wherein the first fiducial at least partially overlaps the second fiducial.

12. The electronic package of claim 11, wherein the first die is bonded to the second die with a hybrid bonding architecture.

13. The electronic package of claim 11, wherein the first die has an active die region, and wherein the fiducial is outside of a footprint of the active die region.

14. The electronic package of claim 11, wherein further comprising:
    a second protrusion extending out from the first die.

15. The electronic package of claim 14, wherein the second protrusion is on a corner of the first die opposite from a corner where the protrusion is located.

16. The electronic package of claim 11, wherein the second fiducial is within an active die region of the second die.

17. The electronic package of claim 11, wherein the first fiducial and the second fiducial are crosses.

18. An electronic system, comprising:
    a board;
    a package substrate coupled to the board;
    a first die on the package substrate; and
    a second die coupled to the first die, wherein the second die comprises:
       a first surface opposite a second surface, and a plurality of edges between the first surface and the second surface;
       a protrusion that extends laterally out from an edge of the plurality of edges at a corner of the second die; and
       a fiducial on the protrusion, wherein the fiducial is outside of a shadow of an active die region of the second die.

19. The electronic system of claim 18, wherein there is no metal over the fiducial in the second die.

20. The electronic system of claim 18, wherein the first die is coupled to the second die with a hybrid bonding interconnect architecture.

* * * * *